United States Patent

McHugh et al.

[11] Patent Number: 6,132,220
[45] Date of Patent: Oct. 17, 2000

[54] LAND GRID ARRAY SOCKET

[75] Inventors: Robert G. McHugh, Evergreen, Colo.;
Nick Lin, Hsin-Chuang, Taiwan

[73] Assignee: Hon Hai Precision Ind. Co., Ltd.,
Taipei Hsien, Taiwan

[21] Appl. No.: 09/372,664

[22] Filed: Aug. 11, 1999

[51] Int. Cl.[7] .................................................. H01R 9/09
[52] U.S. Cl. ........................................... 439/66; 439/526
[58] Field of Search .............................. 439/70–73, 66, 439/526, 525

[56] References Cited

U.S. PATENT DOCUMENTS

| | | | |
|---|---|---|---|
| 4,220,383 | 9/1980 | Scheingold et al. | 439/71 |
| 4,728,297 | 3/1988 | Cohen | 439/525 |
| 5,066,245 | 11/1991 | Walker | 439/52 |
| 5,221,209 | 6/1993 | D'Amico | 439/71 |
| 5,653,598 | 8/1997 | Grabbe | 439/66 |
| 5,713,744 | 2/1998 | Laub | 439/71 |

*Primary Examiner*—Gary F. Paumen
*Attorney, Agent, or Firm*—Wei Te Chung

[57] ABSTRACT

A land grid array connector is electrically connected between a first electrical device and a second electrical device. The land grid array connector comprises an insulative rectangular housing defining a plurality of passageways therein for respectively receiving a resilient contact therein which has a first end electrically contacting with the first electrical device and a second end electrically contacting with the second electrical device. The insulative housing has a body portion and four raised sides extending upward from the body portion, thereby defining a central cavity between the four raised sides for receiving the first electrical device. A first resilient arm and a second resilient arm are formed in respective adjacent raised sides for fittingly engaging the first electrical device in the central cavity.

4 Claims, 8 Drawing Sheets

LAND GRID ARRAY SOCKET

BACKGROUND OF THE INVENTION

1. Field of the Invention

The present invention relates to a land grid array socket for electrically connecting a CPU to a printed circuit board.

2. The Prior Art

Land grid array (LGA) sockets are commonly used with IC packages and do not require soldering procedures during engagement between the LGA socket and a related mother board. Normally, an LGA assembly includes an IC package having a plurality of flat contact pads formed on a bottom surface thereof, a socket having an insulative housing and defining a plurality of passageways therethrough, and a plurality of conductive contacts received in the passageways of the socket. Fastening means consisting of a top plate positioned on a top surface of the IC package, a bottom plate positioned on a bottom surface of the PCB, and a plurality of sets of aligned holes defined through the PCB, the top plate and the bottom plate is used to configure the assembly. Each set of aligned holes receives a screw therein which engages with a washer and a nut thereby sandwiching the LGA assembly between the top and bottom plates of the fastening means.

U.S. Pat. No. 5,653,598 discloses an electrical contact for use in a connector 30 between mutually opposed electrical interfaces 40, 99 such as contact pads respectively formed on an IC package 2 and a printed circuit board 9, as shown in FIG. 12. The conventional contact comprises a generally planar contact body 10 having first and second major faces 110, 120. The body 10 includes a pair of spaced apart spring arms 140, 150 connected by a resilient bight portion 160. The spring arms 140, 150 each have a free end with an outwardly facing edge forming a contact nose 17, 18 for engaging with the corresponding interface 40, 99. Shorting sections 19, 20 generally extend toward each other from the free ends and are offset such that, upon deflection of the spring arms 140, 150 toward each other, the shorting sections 19, 20 overlap and the first major face 110 engages the second major face 120. Thus, a shortened electrical path is formed between the contact noses 17, 18 when the package 2 is urged against the connector 30.

The electrical interface 40 of the IC package 2 may not be able to properly abut against the contact nose 17 of the contact body 10 due to misalignment when the IC package 2 and the printed circuit board 6 are forced to sandwich the connector 30 by a clip or screws. Therefore, it is requisite to provide a positioning structure on the connector to effectively fix the IC package in the connector before an external clamping force is applied on the IC package.

Moreover, the shorting sections 19, 20 may not properly contact each other due to unwanted lateral deflection thereof when the bight of the contact is deformed. Although the inner wall of the passageway receiving the contact may be used to limit the lateral deflection of the shorting sections 19, 20, unwanted scraping of the shorting sections 19, 20 against the inner wall of the passageway may occur thereby adversely affecting the proper overlap of the two shorting sections 19, 20. Proper overlap and engagement of the two shorting sections 19, 20 is difficult to achieve with this structure. Moreover, an additional contact resistance exists between the shorting sections 19, 20 thereby adversely affecting the signal transmission. Additionally, the spring arms 140, 150 occupy too much space especially in the length thereof which causes impossible for fine pitch requirement. It is requisite to provide a new LGA contact which can provide a relatively short transmission path without introducing an additional contact resistance.

SUMMARY OF THE INVENTION

The primary purpose of the present invention is to provide a new LGA connector which can fix a CPU package in position when the CPU package is electrically connected to a printed circuit board via the LGA connector.

In accordance with one aspect of the present invention, a land grid array connector is provided to be electrically connected between a first electrical device and a second electrical device. The land grid array connector comprises an insulative rectangular housing defining a plurality of passageways therein for respectively receiving a resilient contact therein which has a first end electrically contacting with the first electrical device and a second end electrically contacting with the second electrical device. The insulative housing has a body portion and four raised sides extending upward from the body portion, thereby defining a central cavity between the four raised sides for receiving the first electrical device. A first resilient arm and a second resilient arm are formed in respective adjacent raised sides for fittingly engaging the first electrical device in the central cavity.

DETAILED DESCRIPTION OF THE PREFERRED EMBODIMENT

Figure 1:
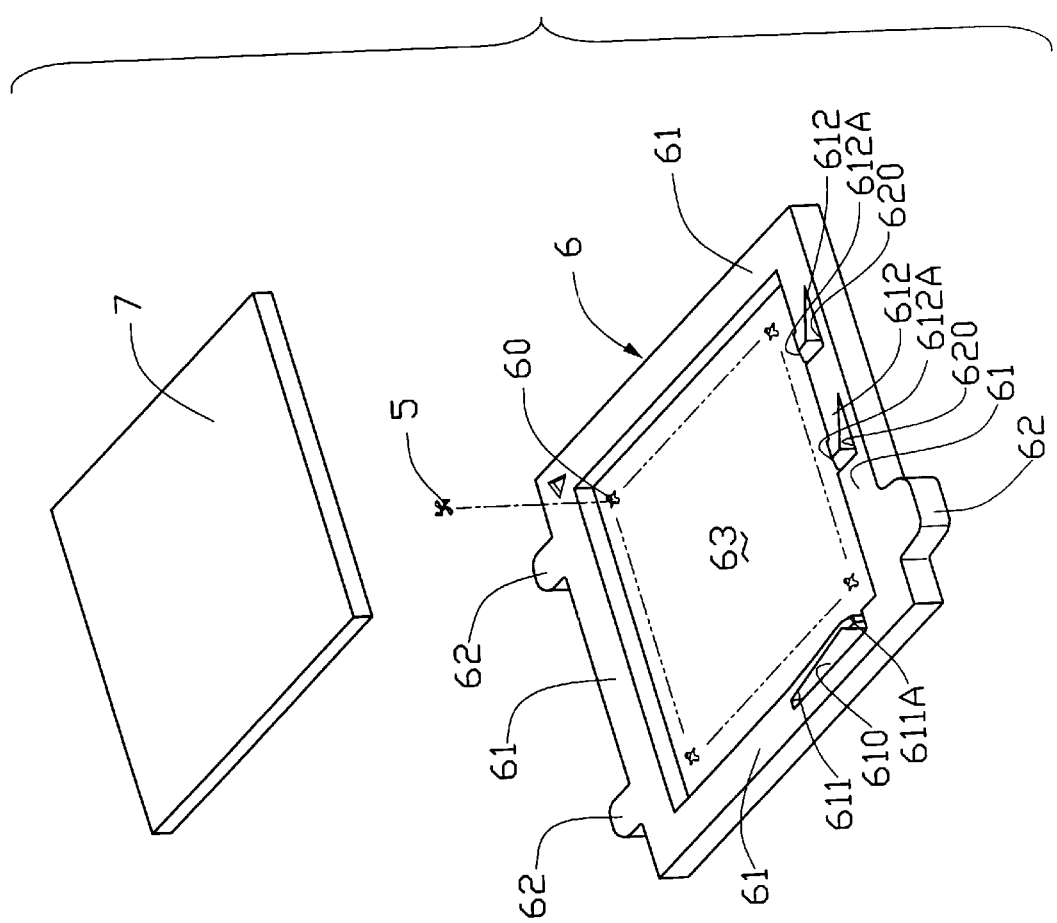
FIG. 1 is an LGA socket in accordance with the present invention for receiving a CPU package.
Figure 2:
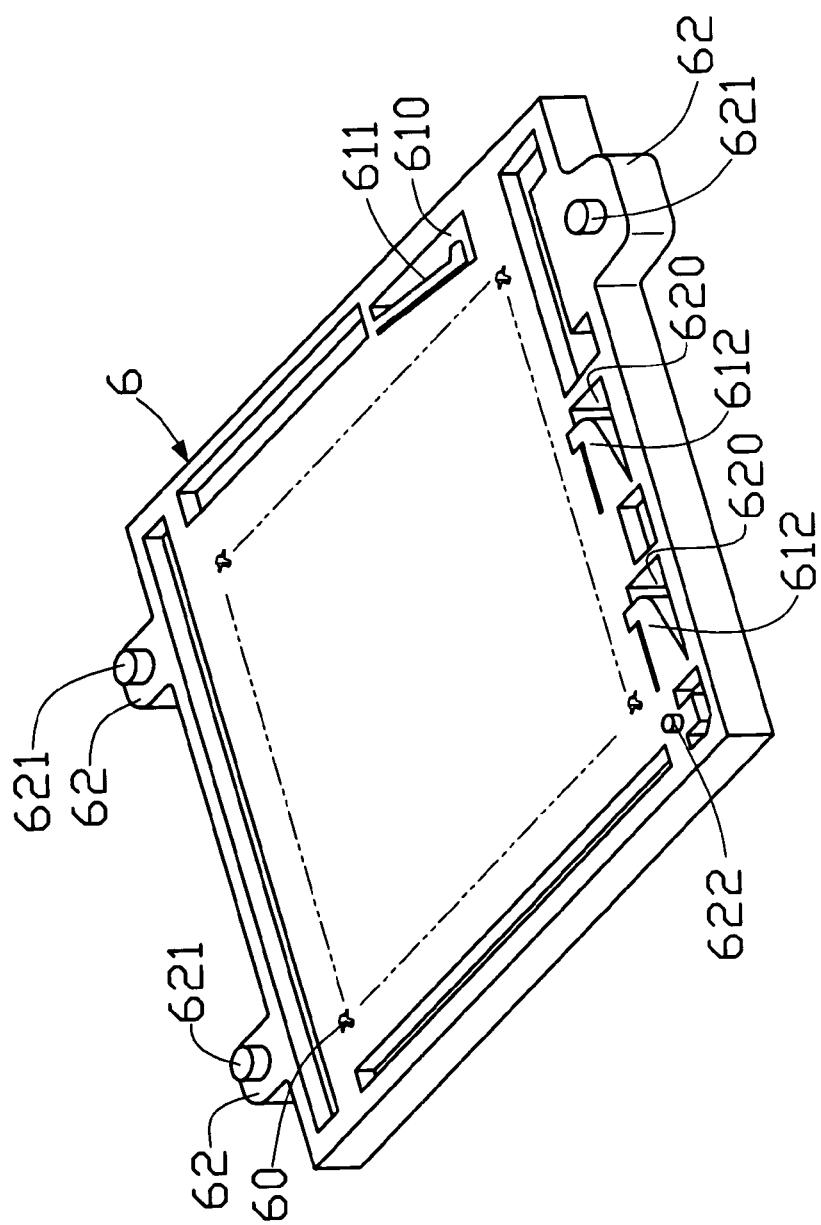
FIG. 2 is a perspective view of the LGA socket of FIG. 1 taken from a different angle.

Referring to FIGS. 1 and 2, an LGA connector in accordance with the present invention comprises an insulative housing 6 defining a plurality of passageways 60 therein for receiving contacts 5. The housing 6 is substantially a body having four raised sides 61 and a central cavity 63 defined between the four raised sides 61 and sized to receive an external electrical device such as a CPU package 7. The passageways 60 are defined through a bottom surface of the central cavity 63. The LGA contact 5 is received in each of the passageways 60. A first resilient arm 611 is formed in one of the four raised sides 61 and capable of deformation in a first space 610 defined in the raised side 61. Two second resilient arms 612 are formed in another raised side 61 adjacent to the one in which the first resilient arm 611 is formed. The second resilient arm 612 is capable of deformation in a second space 620 defined in the raised side 61. The first resilient arm 611 and the second resilient arms 612 each have a chamfer surface 611A, 612A respectively formed in an upper edge thereof for guiding insertion of the CPU package 7 to the central cavity 63. The CPU package 7 is fixed in the cavity 63 by normal force originated from the deformation of the resilient arms 611, 612. Three ears 62 extend from opposite raised sides 61 near three corner of the housing 6 and each ear 62 has a post 621 extending downward for fixing within openings (not shown) of a printed circuit board 9 (see FIG. 6). Similarly, an additional post 622 extending from the bottom of the housing 6 near another corner thereof for fixing within another opening (not shown) of the printed circuit board 9.

Figure 4:
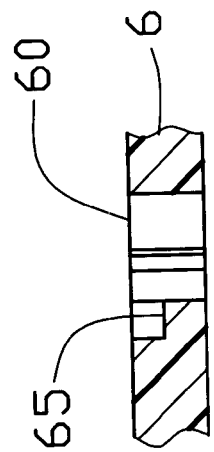
FIG. 4 is a cross-sectional view taken from line 4—4 of FIG. 3.
Figure 3:
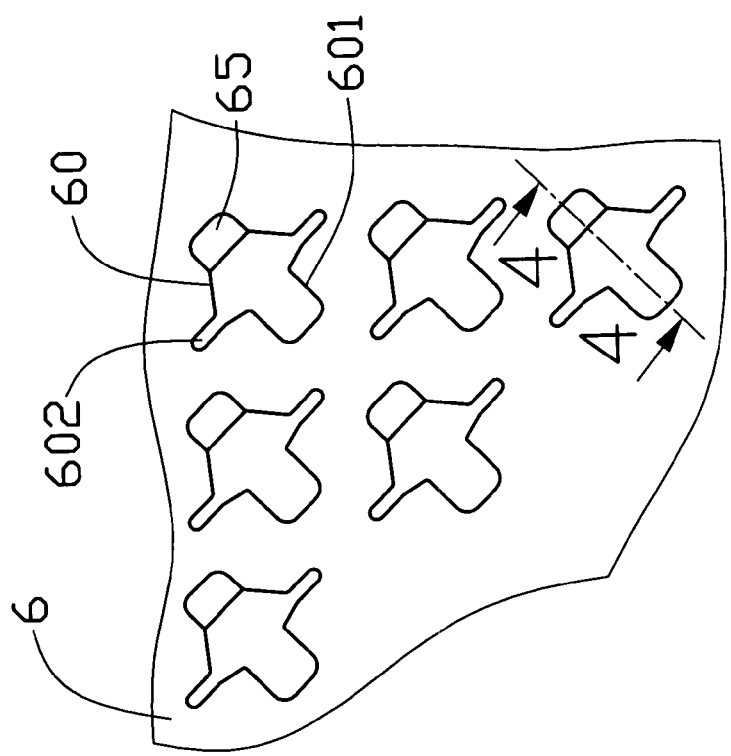
FIG. 3 is an enlarged top view of several passageways of FIG. 1.

Referring to FIGS. 3 and 4, each passageway 60 has a longitudinal wide hole 601 and a lateral narrow hole 602 communicating with and perpendicular to the longitudinal wide hole 601 and a protrusion 65 formed in one end of the longitudinal wide hole 601 thereby forming a depression thereon. The lateral narrow hole 602 is diverged to the longitudinal wide hole 601, therefore the end portions of the lateral narrow hole 601 are narrower than the other portions thereof.

Figure 5:
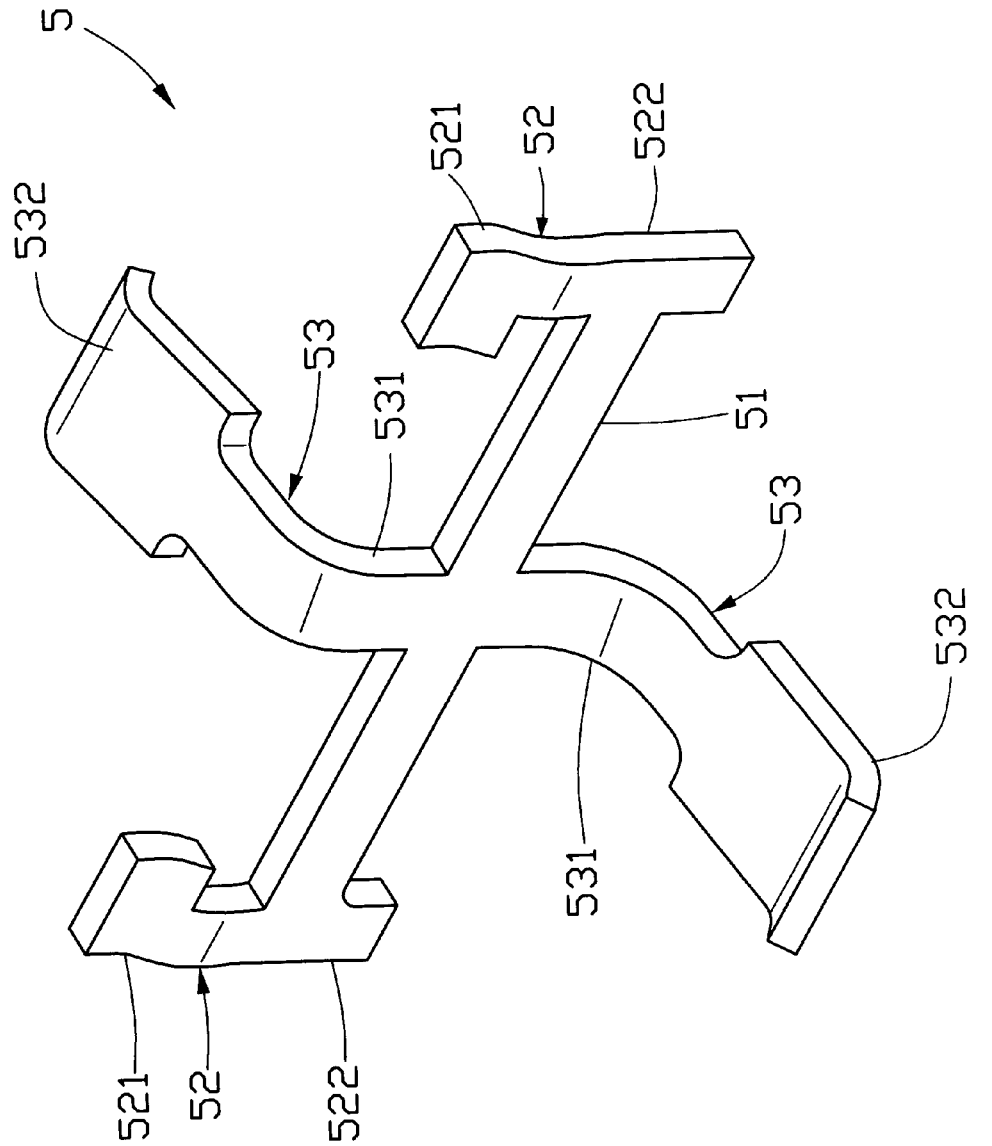
FIG. 5 is an enlarged perspective view of the contact shown in FIG. 1.
Figure 6:
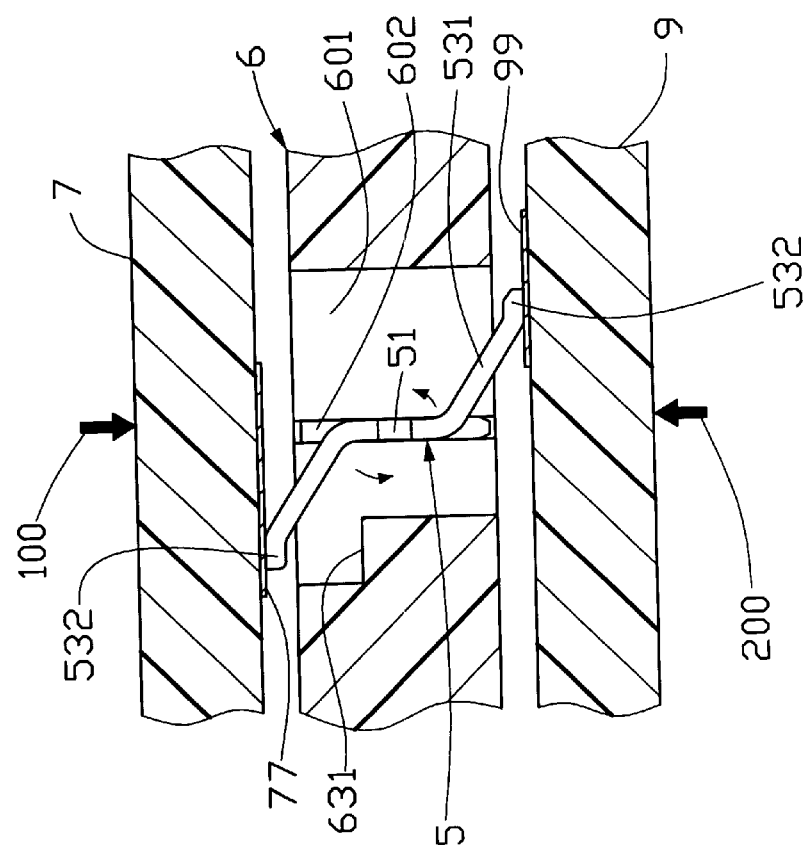
FIG. 6 is a schematic view showing a portion of the socket and two electrical devices before sandwiching the socket.

Referring to FIGS. 5 and 6, the contact 5 comprises a central torsion beam 51, two engagement plates 52 integrally connected to two ends of the central torsion beam 51 and each respectively perpendicular to the torsion beam 51, two spring arms 53 extending oppositely from a center section of the torsion beam 51. Each engagement plate 52 has a plan narrower lower portion 522 for facilitating the load-in of the contact 5 into the passageway 60 and a curved wider upper portion 521 for firmly engaging with the end portion of the lateral narrow hole 602 after the contact 5 is loaded into the passageway 60. Each spring arm 53 has a narrower intermediate portion 531 received in the longitudinal wide hole 601 of the passageway 60 and a wider contacting portion 532 extending out of the passageway 60.

Figure 7:
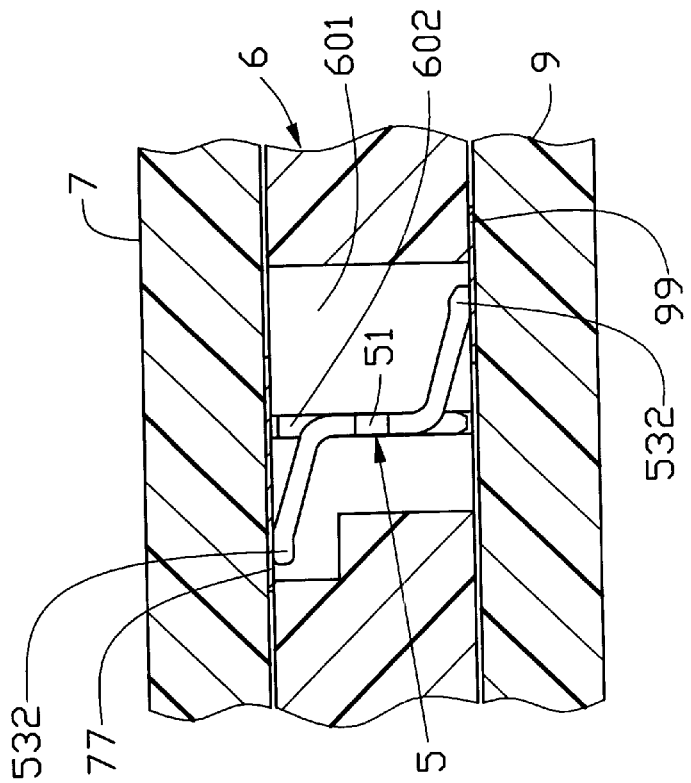
FIG. 7 is a schematic view showing a portion of the socket and two electrical devices sandwiching the socket.
Figure 8:
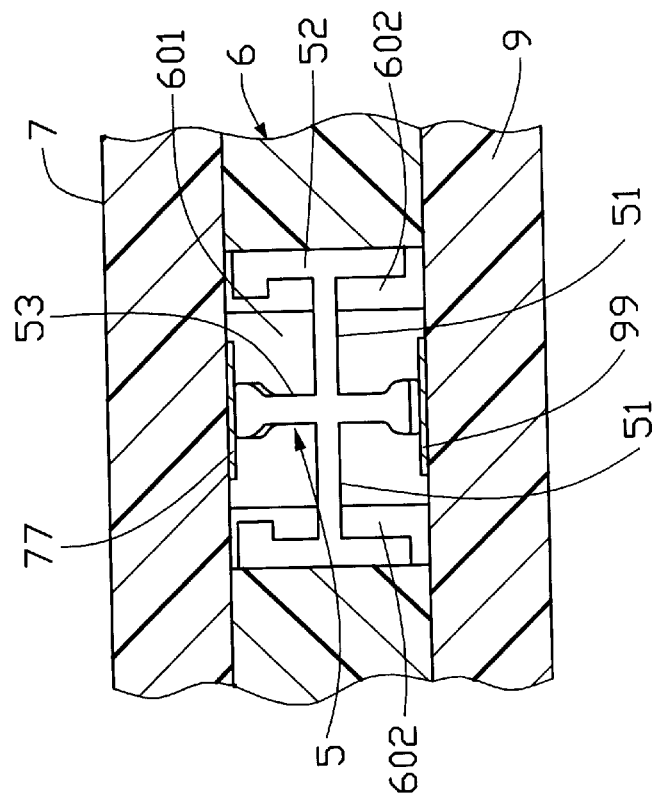
FIG. 8 is a schematic view showing a portion of the socket and two electrical devices before sandwiching the socket.
Figure 9:
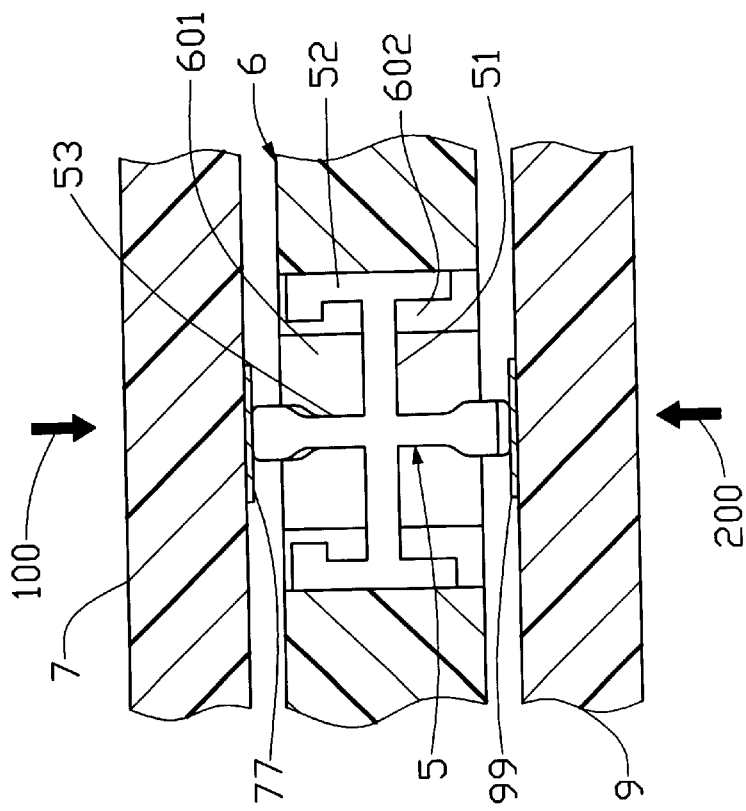
FIG. 9 is a schematic view showing a portion of the socket and two electrical devices sandwiching the socket.

The CPU package 7 having a contact pad 77 and a printed circuit board 9 having a contact pad 99 respectively register with the contacting portions 532 of the same contact 5 of the LGA connector. The CPU package 7 and the printed circuit board 9 respectively exert opposite forces 100, 200 on the contact 5 by a clip or screws (not shown) thereby causing the central torsion beam 51 to be twisted for a predetermined angle which in turn providing a normal force to the contacting portions 532 of the contact 5 to abut against the contact pads 77, 99 respectively as shown in FIG. 7. The spring arm 53 also deforms to provide the contacting portions 532 another normal force to abut against the contact pads 77, 99. FIGS. 8 and 9 illustrate the similar operational relation between the contact 5 and the electrical pads 77, 99 taken from a different viewing angle.

Figure 10:
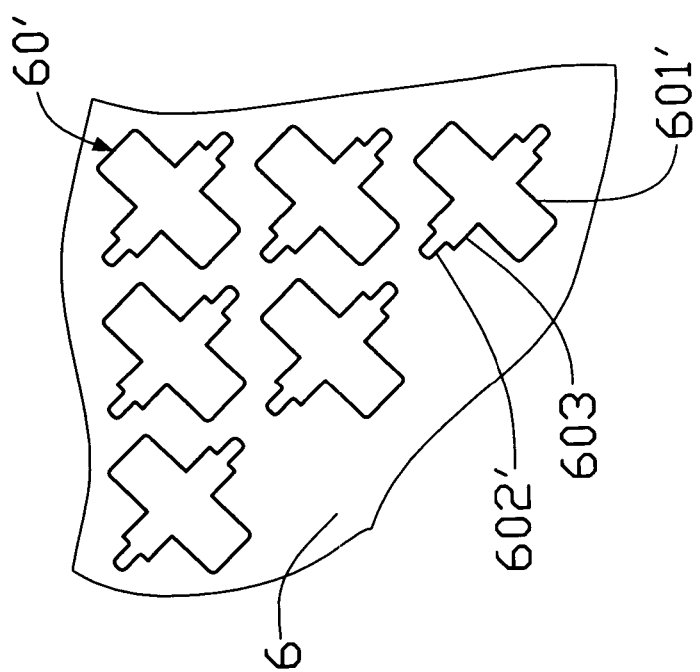
FIG. 10 is a second embodiment of the passageways taken from a top view.
Figure 12:
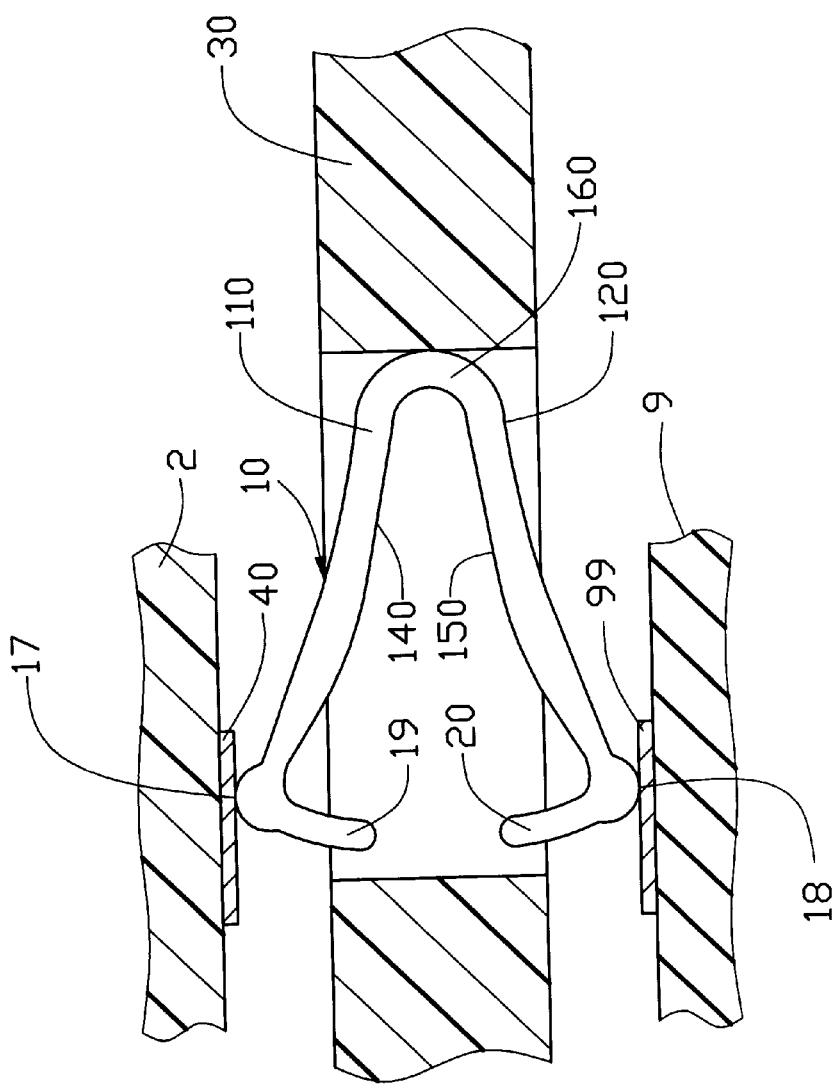
FIG. 12 is a schematic view of a conventional contact received in an LGA connector and sandwiched between an IC package and a printed circuit board.

The shape of the passageway 60 may be varied from that shown in FIG. 3. FIG. 10 illustrates a second embodiment of a passageway 60' which includes a longitudinal wide hole 601' and a lateral narrow hole 602' substantially perpendicular to the longitudinal wide hole 601'. Similar to previous embodiment, the engagement plates 52 of each contact 5 is retained in the lateral narrow hole 602' and the spring arms 53 are deformable in the longitudinal wide hole 601'. An intermediate hole 603 which is wider than the lateral hole 602' and communicated between the longitudinal wide hole 601' and the lateral narrow hole 602' is used for providing enough space for rotation of the torsion beam 51 of the contact 5.

Figure 11:
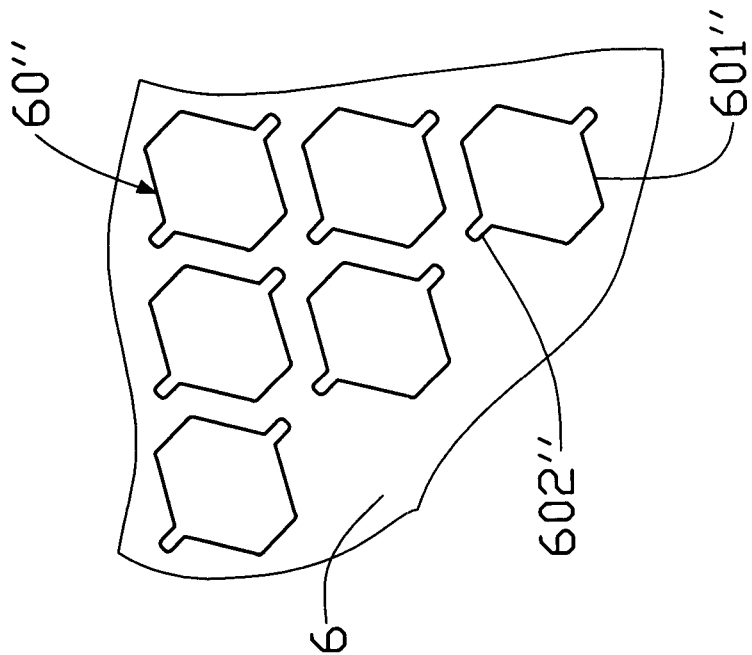
FIG. 11 is a third embodiment of the passageways taken from a top view.

The shape of the passageway 60 may also be varied from that shown in FIG. 10. FIG. 11 illustrates a third embodiment of a passageway 60" which includes a longitudinal wide hole 601" and a lateral narrow hole 602" communicating with the longitudinal wide hole 601". The engagement plates 52 of the contact 5 are engaged within the lateral narrow hole 602" and the torsion beam 51 of the contact 5 is rotatably received in the longitudinal wide hole 601".

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A land grid array connector for electrically connecting between a first electrical device and a second electrical device, the land grid array connector comprising:
   an insulative rectangular housing defining a plurality of passageways therein for respectively receiving a resilient contact therein which has a first end electrically contacting with the first electrical device and a second end electrically contacting with the second electrical device;
   the insulative housing having a body portion and four raised sides extending upward from the body portion, thereby defining a central cavity between the four raised sides for receiving the first electrical device;
   at least a first resilient arm and a second resilient arm being formed in respective adjacent raised sides for fittingly engaging the first electrical device in the central cavity;
   wherein each passageway is defined through a bottom of the central cavity and comprises a relatively wide longitudinal hole and a relatively narrow longitudinal hole substantially perpendicular to and communicating with the relatively wide longitudinal hole;
   wherein the relatively wide longitudinal hole has an axis substantially parallel to a diagonal line of the insulative housing;
   wherein the relatively wide longitudinal hole has one end thereof formed with a depression.

2. The land grid array connector as claimed in claim 1, wherein the at least one first resilient arm and the at least one second resilient arm each have a chamfer surface respectively formed in an upper edge thereof for guiding insertion of the first electrical device to the central cavity.

3. The land grid array connector as claimed in claim 1 further comprising posts extending downward from a bottom surface thereof for connection to the second electrical device.

4. The land grid connector as claimed in claim 3, wherein the posts are located near four corners of the insulative housing.

* * * * *